(12) United States Patent
Siegenbrink et al.

(10) Patent No.: US 11,432,425 B2
(45) Date of Patent: Aug. 30, 2022

(54) BASE MODULE AND FUNCTIONAL MODULE FOR A SWITCH-CABINET SYSTEM, AND SWITCH-CABINET SYSTEM

(71) Applicant: Beckhoff Automation GmbH, Verl (DE)

(72) Inventors: Daniel Siegenbrink, Bielefeld (DE); Hans Beckhoff, Verl (DE); Holger Büttner, Berlin (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 17/339,315

(22) Filed: Jun. 4, 2021

(65) Prior Publication Data

US 2021/0298189 A1 Sep. 23, 2021

Related U.S. Application Data

(63) Continuation of application No. PCT/EP2019/084699, filed on Dec. 11, 2019.

(30) Foreign Application Priority Data

Dec. 28, 2018 (DE) .................... 10 2018 133 657.8

(51) Int. Cl.
*G06F 1/16* (2006.01)
*H05K 5/00* (2006.01)
(Continued)

(52) U.S. Cl.
CPC ......... *H05K 7/1452* (2013.01); *H05K 7/1447* (2013.01)

(58) Field of Classification Search
CPC .. H05K 7/1452; H05K 7/1447; H05K 7/1439; H05K 7/1438; H05K 7/1454;
(Continued)

(56) References Cited

U.S. PATENT DOCUMENTS 789,671 A 5/1905 Reich
4,152,750 A * 5/1979 Bremenour .......... H05K 7/1465
361/796

(Continued)

FOREIGN PATENT DOCUMENTS

CN 1662128 A 8/2005
CN 1684578 A 10/2005
(Continued)

OTHER PUBLICATIONS

Japanese Office Action dated Jan. 31, 2022 in connection with Japanese patent application No. 2021-53787, 4 pages including English translation.
(Continued)

*Primary Examiner* — Anthony M Haughton
(74) *Attorney, Agent, or Firm* — Dorsey & Whitney LLP

(57) ABSTRACT

A base module for a switch-cabinet system, having a plurality of communication units and connection elements for a plurality of functional modules. The connection elements are configured to engage in module-connection elements of functional modules. Each connection element has at least one data connection. Each communication unit is in each case connected to at least one data connection of a connection element. The communication units are connected to one another by a data bus. The base module has a first field-bus connection. The data bus is connected to the first field-bus connection to connect the communication units to a field-bus.

14 Claims, 13 Drawing Sheets

(51) Int. Cl.
*H05K 7/00* (2006.01)
*H05K 7/14* (2006.01)

(58) Field of Classification Search
CPC .. H05K 7/1455; H05K 7/1448; H05K 7/1449; H05K 7/1451
See application file for complete search history.

(56) References Cited

U.S. PATENT DOCUMENTS

| | | | |
|---|---|---|---|
| 5,493,194 A * | 2/1996 | Damiano | H05K 7/1484 |
| | | | 318/575 |
| 5,510,960 A | 4/1996 | Rosen | |
| 5,716,241 A | 2/1998 | Hennemann et al. | |
| 5,761,052 A | 6/1998 | Wheeler-King et al. | |
| 6,123,585 A | 9/2000 | Hussong et al. | |
| 6,172,875 B1 | 1/2001 | Suzuki et al. | |
| 6,172,877 B1 | 1/2001 | Feye-Hohmann et al. | |
| 6,881,101 B2 | 4/2005 | Sichner et al. | |
| 6,916,194 B2 | 7/2005 | Sichner et al. | |
| 7,021,974 B2 | 4/2006 | Sichner et al. | |
| 7,257,003 B2 | 8/2007 | Ono | |
| 7,277,286 B2 | 10/2007 | Lee | |
| 7,397,668 B2 | 7/2008 | Sekine et al. | |
| 7,616,453 B2 | 11/2009 | Bergmann | |
| 7,724,521 B2 | 5/2010 | Nelson et al. | |
| 7,753,740 B2 | 7/2010 | DeCarolis et al. | |
| 7,933,104 B2 * | 4/2011 | Bauer | G05B 9/02 |
| | | | 361/93.1 |
| 7,967,646 B2 | 6/2011 | DeCarolis et al. | |
| 8,891,220 B2 * | 11/2014 | Shimizu | B60L 3/04 |
| | | | 361/103 |
| 9,112,318 B2 * | 8/2015 | Cech | H01R 9/2675 |
| 9,456,518 B2 | 9/2016 | Bury et al. | |
| 9,474,187 B2 | 10/2016 | Nelson et al. | |
| 9,936,598 B2 | 4/2018 | Gruber | |
| 9,992,898 B2 | 6/2018 | Tsutsumi et al. | |
| 10,140,226 B2 | 11/2018 | Veil et al. | |
| 2004/0201972 A1 * | 10/2004 | Walesa | H05K 7/1484 |
| | | | 361/788 |
| 2005/0185381 A1 | 8/2005 | Ono | |
| 2006/0126277 A1 * | 6/2006 | Tomkowiak | H02M 7/003 |
| | | | 361/601 |
| 2006/0136622 A1 | 6/2006 | Rouvelin et al. | |
| 2006/0259670 A1 | 11/2006 | Meinke et al. | |
| 2007/0066147 A1 | 3/2007 | Braunlich et al. | |
| 2009/0021920 A1 | 1/2009 | Hund et al. | |
| 2009/0309467 A1 | 12/2009 | Nelson et al. | |
| 2009/0310312 A1 | 12/2009 | Wayman et al. | |
| 2010/0103627 A1 | 4/2010 | Nelson et al. | |
| 2011/0131455 A1 * | 6/2011 | Law | H04L 25/0278 |
| | | | 714/E11.159 |
| 2011/0164350 A1 | 7/2011 | Kanaya et al. | |
| 2011/0256749 A1 | 10/2011 | Bayerer | |
| 2012/0206881 A1 | 8/2012 | Nelson et al. | |
| 2012/0243623 A1 | 9/2012 | Kisakuerek | |
| 2013/0336359 A1 * | 12/2013 | Zink | G01K 7/023 |
| | | | 156/60 |
| 2013/0342152 A1 | 12/2013 | Maeda et al. | |
| 2014/0160679 A1 | 6/2014 | Kelty | |
| 2014/0307367 A1 | 10/2014 | Maeda et al. | |
| 2015/0257286 A1 | 9/2015 | Sichmann et al. | |
| 2016/0037660 A1 | 2/2016 | Budde et al. | |
| 2016/0254612 A1 | 9/2016 | Andrei et al. | |
| 2016/0320761 A1 | 11/2016 | Kirsamer et al. | |
| 2016/0349721 A1 * | 12/2016 | Kang | G05F 1/66 |
| 2017/0374756 A1 | 12/2017 | Leen et al. | |
| 2018/0069359 A1 | 3/2018 | Müller et al. | |
| 2021/0289653 A1 | 9/2021 | Beckhoff | |
| 2021/0289654 A1 | 9/2021 | Beckhoff | |
| 2021/0385964 A1 | 12/2021 | Beckhoff et al. | |

FOREIGN PATENT DOCUMENTS

| | | |
|---|---|---|
| CN | 101080858 A | 11/2007 |
| CN | 101192056 A | 6/2008 |
| CN | 101690019 A | 3/2010 |
| CN | 102047349 B | 5/2013 |
| CN | 103858281 A | 6/2014 |
| CN | 204014380 U | 12/2014 |
| CN | 104662844 A | 5/2015 |
| CN | 105580214 A | 5/2016 |
| CN | 105684563 A | 6/2016 |
| CN | 105746006 A | 7/2016 |
| CN | 105101753 B | 8/2017 |
| CN | 208400835 U | 1/2019 |
| DE | 4140611 C1 | 5/1993 |
| DE | 19525438 A1 | 1/1997 |
| DE | 19651961 A1 | 6/1998 |
| DE | 19748429 A1 | 5/1999 |
| DE | 19748531 A1 | 5/1999 |
| DE | 19902745 A1 | 8/2000 |
| DE | 19923569 A1 | 11/2000 |
| DE | 10006879 A1 | 8/2001 |
| DE | 4437316 C2 | 12/2001 |
| DE | 69715868 T2 | 10/2002 |
| DE | 10148470 A1 | 4/2003 |
| DE | 20211002 U1 | 12/2003 |
| DE | 102004018115 A1 | 11/2005 |
| DE | 102006056001 A1 | 6/2008 |
| DE | 102009005546 A1 | 12/2009 |
| DE | 102006049631 B4 | 3/2011 |
| DE | 102011110184 A1 | 2/2013 |
| DE | 202013003925 U1 | 6/2013 |
| DE | 102012213281 A1 | 1/2014 |
| DE | 102012021055 A1 | 4/2014 |
| DE | 102013202591 A1 | 8/2014 |
| DE | 102016000126 A1 | 7/2016 |
| DE | 112013007698 A5 | 9/2016 |
| DE | 202017104591 U1 | 11/2018 |
| DE | 102018133646 A1 | 7/2020 |
| DE | 102018133647 A1 | 7/2020 |
| DE | 102018133657 A1 | 7/2020 |
| DE | 102019106082 B4 | 6/2021 |
| EP | 0236711 A2 | 9/1987 |
| EP | 0661915 A1 | 7/1995 |
| EP | 0323579 B1 | 3/1997 |
| EP | 0895708 B1 | 10/1999 |
| EP | 1258957 A1 | 11/2002 |
| EP | 1269809 B1 | 10/2004 |
| EP | 1595313 B1 | 6/2007 |
| EP | 1593312 B1 | 8/2008 |
| EP | 1668969 B1 | 10/2009 |
| EP | 2111088 A2 | 10/2009 |
| EP | 2183751 A1 | 5/2010 |
| EP | 1383368 B1 | 12/2010 |
| EP | 2642602 A1 | 9/2013 |
| EP | 2642603 A1 | 9/2013 |
| EP | 2793540 A2 | 10/2014 |
| EP | 2986093 A1 | 2/2016 |
| EP | 3018983 A2 | 5/2016 |
| EP | 3019983 A1 | 5/2016 |
| JP | 2016502266 A | 1/2016 |
| JP | 2016534422 A | 11/2016 |
| WO | 2004057937 A1 | 7/2004 |
| WO | 2008101513 A1 | 8/2008 |
| WO | 2009014530 A1 | 1/2009 |
| WO | 2015063292 A1 | 5/2015 |
| WO | 2015090345 A1 | 6/2015 |
| WO | 2020136010 A2 | 7/2020 |
| WO | 2020136081 A1 | 7/2020 |
| WO | 2020136084 A1 | 7/2020 |
| WO | 2020182877 A1 | 9/2020 |

OTHER PUBLICATIONS

"Backplane," Wikipedia, 6 pages, <https://en.wikipedia.org/wiki/Backplane#Active_versus_passive_ . . . >.

(56) References Cited

OTHER PUBLICATIONS

"Festo and Rockwell: A partnership built on a shared commitment," <https://www.festo.com/us/en/e/iot-technologies/festo-and-rockwell . . . > 6 pages.
"I/O-System" Hans Turek GmbH Co. KG, 10 pages, <https://www.turck.de/de/productgroup/Feldbustechnik . . . >.
"Passive Backplanes," Advantech, 1 page, <https://www.advantech.eu/products/passive-backplanes/sub_1-2jkogc>.
"Schaltschrank," Wikipedia, <https://de.wikipedia.org/w/index.php?title=Schaltschrank&oldid=. . . >, 9 pages with English translation.
"Verfahrenstechnik," Wikipedia, <https://de.wikipedia.org/w/index.php?title+Verfahrenstechnik . . . >, 21 pages including English translation.
"Werkzeugmaschine," Wikipedia, <https://de.wikipedia.org/w/index.php?title_Werkzeugmaschine . . . > 49 pages including English translation.
"Simatic ET 200, The I/O system for both inside and outside the control cabinet," Siemens, (2015) 18 pages including English translation.
Graphite Module: Crimson Control, Red Lion Automation Series, "IEC 61131 Logic Control Programming," 2016, 2 pages.
Red Lion Graphite Core Controller, Red Lion Automation Series, "Rugged Standalone Industrial Controller," 2016, 2 pages.
"35 solutions worth seeing at SPS IPC Drives," Vogel Business Media, 2017, 3 pages including English translation.
Red Lion Graphite HMIs, Red Lion Automation Series, "Rugged Operator Panels with Modular I/O," 2017, 4 pages.
"Simatic, ET 200pro Interfacemodul IM 154-8 CPU," Siemens, Dec. 2006, 280 pages including partial English translation.
Partial Search Report dated Mar. 13, 2020 in connection with International Patent Application No. PCT/EP2019/084699, 27 pages including English translation.
International Search Report and Written Opinion dated Mar. 27, 2020 in connection with International Patent Application No. PCT/EP2019/086344, 32 pages including English translation.
International Search Report and Written Opinion dated Apr. 1, 2020 in connection with International Patent Application No. PCT/EP2019/086359, 30 pages including English translation.
International Search Report and Written Opinion dated Jun. 24, 2020 in connection with International Patent Application No. PCT/EP2019/084699, 37 pages including English translation.
Examination report dated Jun. 8, 2019 in connection with German patent application No. 10 2018 133 646.2, 18 pages including English translation.
Allen-Bradley, "FlexArmor" 1798 Technical Data, Aug. 2001, 20 pages.
Examination Report dated Aug. 13, 2019 in connection with German patent application No. DE 10 2018 133 657.8, 16 pages including English translation.
Examination Report dated Aug. 8, 2019 in connection with German patent application No. DE 10 2018 133 647.0, 18 pages including English translation.
"Simatic, Dezentrales Peripheriesystem ET 200pro," Siemens, Sep. 2016, 517 pages including partial English translation.
EP9128—Ether_CAT-Sternverteiler in Schutzart IP67—Version 2.2.0, Beckhoff GmbH, Jul. 13, 2015, 45 pages.
Office Action dated Nov. 30, 2021 in connection with European patent application No. 19821065.0, 18 pages including English translation.
International Search Report and Written Opinion dated Jun. 4, 2020 in connection with International Patent Application No. PCT/EP2020/056494, 31 pages including translation.
International Preliminary Report on Patentability dated Jul. 14, 2021 in connection with International Patent Application No. PCT/EP2020/056494, 33 pages including translation.
Office Action dated Feb. 25, 2022 in connection with Chinese patent application No. 20980086931.9, 22 pages including English translation.
Office Action dated Feb. 28, 2022 in connection with Chinese patent application No. 201980086815.7, 24 pages including English translation.
First Office Action dated Mar. 24, 2022 in connection with Chinese patent application No. 201980086871.0, 10 pages including English translation.
Office Action dated Jun. 8, 2022 in connection with Chinese Patent Application No. 2022080020520.2, 9 pages including English translation.

\* cited by examiner

BASE MODULE AND FUNCTIONAL MODULE FOR A SWITCH-CABINET SYSTEM, AND SWITCH-CABINET SYSTEM

CROSS REFERENCE TO RELATED APPLICATIONS

This is a continuation of International Patent Application PCT/EP2019/084699, BASE MODULE AND FUNCTIONAL MODULE FOR AN ELECTRICAL ENCLOSURE SYSTEM, AND ELECTRICAL ENCLOSURE SYSTEM, filed 11 Dec. 2019, which claims priority to German Patent Application DE 10 2018 133 657.8, BASISMODUL UND FUNKTIONSMODUL FÜR EIN SCHALT-SCHRANKSYSTEM UND SCHALTSCHRANKSYSTEM, filed 28 Dec. 2018, each of which is incorporated by reference herein, in the entirety and for all purposes.

FIELD

This present invention relates to a base module and a functional module for a switch-cabinet system and to a switch-cabinet system.

BACKGROUND

From publication DE 100 06 879 A1, a modular control system having a base module and functional modules connected to the base module is known. A disadvantage of the modular control system is that, in the event of a defect in a functional module, communication on a field-bus of the control system may be interrupted so that field-bus subscribers which are arranged downstream of the affected functional module, seen from a controller of the automation system comprising the control system, cannot be addressed by the controller. Communication on the field-bus may also be interrupted if a functional module is replaced. This means that it may not be possible to replace components during operation of the automation system. Instead, the automation system and the communication on the field-bus must be restarted after a functional module has been replaced, which would mean an undesired downtime in production if the automation system were used in a production machine, for example, because the production machine could not be operated continuously.

SUMMARY

It is an object of the present invention to provide an improved base module for a switch-cabinet system, an improved functional module for a switch-cabinet system and a switch-cabinet system having a base module and a functional module. This object is solved by a base module for a switch-cabinet system, by a functional module for a switch-cabinet system and by a switch-cabinet system having a base module and a functional module with the features of the independent claims. Advantageous further embodiments are indicated in dependent claims.

EXAMPLES

A base module for a switch-cabinet system according to the invention has a plurality of communication units and connection elements for a plurality of functional modules. The connection elements are embodied to engage in module-connection elements of functional modules. Each connection element has at least one data connection. Each communication unit is connected to at least one data connection of a connection element. The communication units are connected to each other via a data bus. The base module has a first field-bus connection. The data bus is connected to the first field-bus connection for connecting the communication units to a field-bus.

The base module may be connected to functional modules via its connection elements to form the switch-cabinet system. A switch-cabinet system comprises electrical and electronic components of an automation system. A switch-cabinet system forms an automation system together with connected field devices. A switch-cabinet system functions as a distribution system. For example, electrical voltages may be distributed by the switch-cabinet system and provided to field devices.

The communication units (which in some examples may also be referred to as slaves) are connected to each other via the data bus and form a communication network in the switch-cabinet system. The communication units may therefore exchange data with each other. Communication or data exchange between the base module and functional modules may also take place via the communication units connected to the connection elements. All communication units are arranged in the base module. Thus, the base module has the advantage that in the event of a defect or replacement of a functional module, aBrieggctional modules that are still intact may be addressed via the data bus. For this reason, a functional module may be replaced during operation of an automation system. Furthermore, an automation system does not need to be initialized if a configured functional module replacing a functional module is connected to the base module. If the automation system is used in a production machine, for example, this may prevent undesired production downtime.

In embodiments of the present invention, a first data connection of a first connection element forms the first field-bus connection. The first data connection is embodied to engage in a first module-data connection of a first module-connection element of a functional module. A functional module embodied as a feed-in module may thus advantageously transmit and receive data via the first data connection.

In embodiments of the present invention, a first data connection of a second connection element forms a second field-bus connection to which the data bus is connected. The first data connection of the second connection element is embodied to engage in a first module-data connection of a second module-connection element of a functional module. Advantageously, the communication units may be addressed in a redundant manner via the second field-bus connection. If, for example, a communication unit fails, all communication units located between the first field-bus connection and the defective communication unit may be addressed from the first field-bus connection. All communication units located between the defective communication unit and the second field-bus connection may be addressed from the second field-bus connection. Alternatively, the second field-bus connection allows the base module to be connected to further base module. In this context, the second field-bus connection is connected to a field-bus connection of the further base module.

In embodiments of the present invention, a first voltage connection of one of the connection elements forms a first supply connection for feeding a first supply voltage into the base module. At least one of the remaining connection elements has a further first voltage connection for forwarding the first supply voltage to a functional module. The first supply connection is connected to the further first voltage connection. Therefore, the first supply voltage may be provided to functional modules. The first supply voltage may e.g. be used to operate field devices connected to functional modules.

In embodiments of the present invention, the base module has a safety device connected to the data bus, which is at least connected to a safety circuit. The safety circuit is connected to the first supply connection. The safety circuit is connected to the further first voltage connection for the protected forwarding of the first supply voltage to a functional module. Advantageously, the safety device and the safety circuit may allow for not passing the first supply voltage on to a functional module if the first supply voltage is outside of a permissible range.

In embodiments of the present invention, the first supply connection is connected to a converter. The converter is connected to each communication unit. The converter is embodied to provide the communication units with a bus voltage from the first supply voltage for operation. Advantageously, the bus voltage does not have to be fed into the base module via a connection element if the converter generates the bus voltage from the first supply voltage.

In embodiments of the present invention, at least one of the connection elements has a bus-voltage connection for forwarding the bus voltage to a functional module. The converter is connected to the bus-voltage connection. Advantageously, the bus voltage is in this way provided to components of functional modules. The bus voltage may, for example, be made available for operation to internal control devices of functional modules, such as microcontrollers. Internal control devices of functional modules may, for example, be embodied to control field devices.

In embodiments of the present invention, a monitoring unit is connected to the data bus. The monitoring unit has at least one sensor connection. Advantageously, the monitoring unit is embodied to monitor a parameter that affects the base module. The parameter may e.g. be a temperature inside of the base module, a temperature outside the base module, air pressure and/or humidity.

A functional module for a switch-cabinet system comprises a first module connector embodied to engage with a connection element of a base module. The functional module has a first field-bus-module connection. The first module-connection element has a first module-data connection. The first field-bus-module connection is connected to the first module-data connection. The first module-data connection is embodied to engage in a first data connection of a first connection element of the base module, which forms the first field-bus connection. Advantageously, the functional module is embodied as a feed-in module for feeding data into the base module. The functional module is therefore embodied as a feed-in module and may advantageously transmit data to the base module via the first field-bus-module connection and the first module-data connection of the module-connection element or receive data from the base module.

In embodiments of the present invention, the functional module has a further communication unit. The further communication unit is connected to the first field-bus-module connection and to the first module-data connection. The further communication unit is connected to an electronic circuit. Advantageously, the further communication unit may be connected to a power-supply unit of the electronic circuit, for example, in order to address the power-supply unit. This e.g. allows for the first supply voltage to be set.

In embodiments of the present invention, the functional module has a module-supply connection for feeding a supply voltage into the functional module. The module-supply connection is connected to a further voltage connection of the first module-connection element to forward the supply voltage to the base module. Advantageously, the supply voltage may be fed into the base module by the functional module embodied as a feed-in module and may be made available to further functional modules by the base module.

In embodiments of the present invention, the functional module has a second field-bus-module connection and a second module-connection element. The second module-connection element has a first module-data connection. The second field-bus-module connection is connected to the first module-data connection of the second module-connection element. The first module-data connection of the second module-connection element is embodied to engage in a first data connection of a second connection element of the base module, which forms a second field-bus connection. Advantageously, the functional module may allow for connecting a further base module to the base module or to address the communication units in a redundant manner by the second field-bus-module connection.

A switch-cabinet system has a base module and a functional module. The first module-connection element of the functional module engages with a first connection element of the base module.

In embodiments of the present invention, the switch-cabinet system has at least a further functional module. A further module-connection element of the further functional module engages in a connection element of the base module. The further functional module is embodied as an output module. Field devices may be connected to the further functional module. The switch-cabinet system offers the advantage that in the event of a defect or replacement of the additional functional module, further intact functional modules may still be addressed via the data bus. For this reason, the additional functional module may be exchanged during operation of an automation system comprising the switch-cabinet system without having to initialize the automation system if a further functional module is configured to replace it. When using the automation system in a production machine, for example, this may prevent an undesired loss of production.

BRIEF DESCRIPTION OF THE DRAWINGS

The properties, features and advantages of the present invention described above and the way in which they are achieved are more clearly and comprehensibly explained in connection with the following description of embodiment examples, which are explained in more detail in connection with the drawings. Said drawings schematically show.

DETAILED DESCRIPTION

Figure 1:
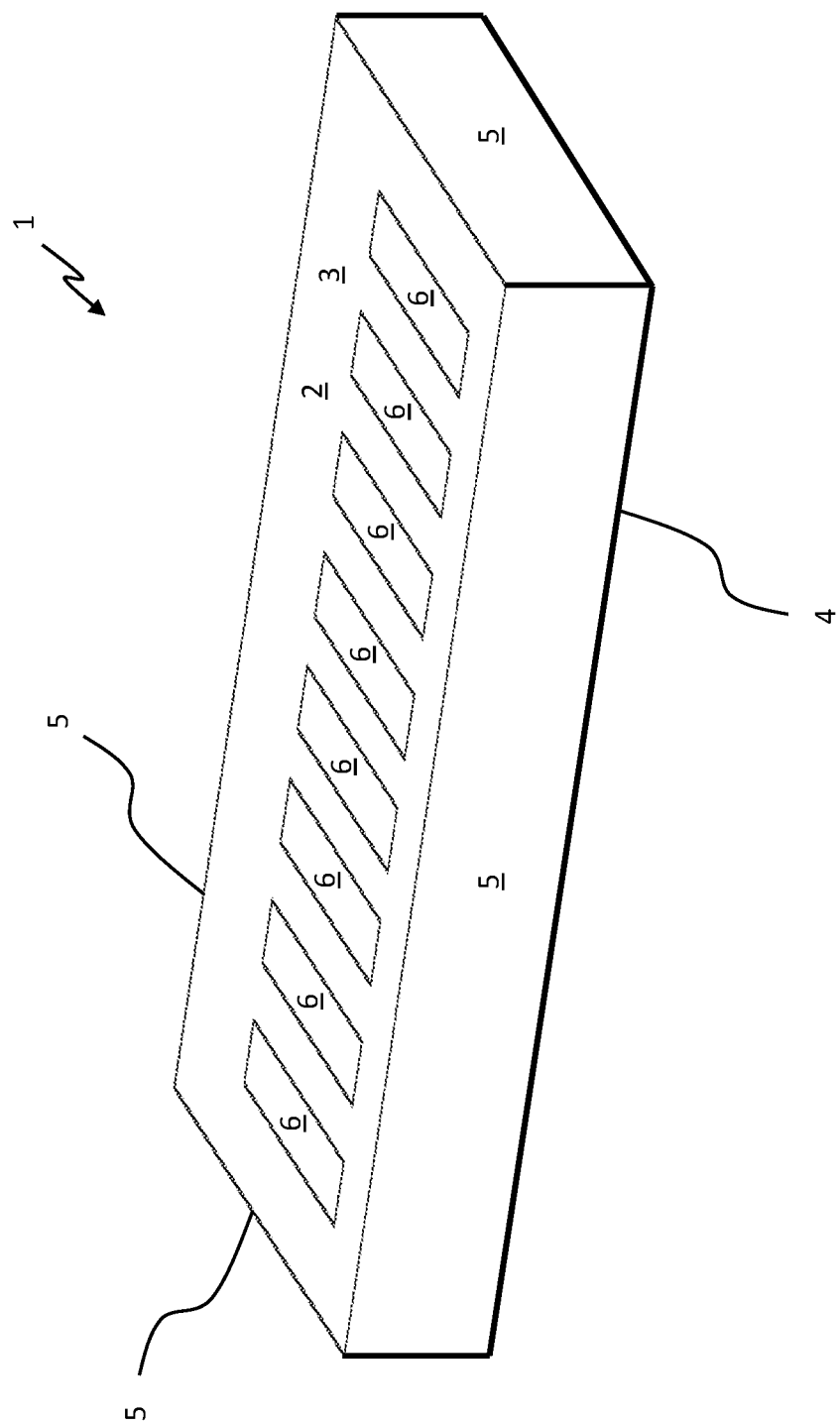
FIG. 1: a first base module according to a first embodiment for a switch-cabinet system in a perspective view.

FIG. 1 schematically shows a first base module 1 according to a first embodiment for a switch-cabinet system in a perspective view.

The first base module 1 comprises a housing 2. The housing 2 may be made completely or at least partially of a metallic material, for example aluminum. The housing 2 has a top side 3, a bottom side 4 opposite to the top side 3 and four side walls 5. The top side 3 of housing 2 has a plurality of apertures 6. As an example, the top side 3 in FIG. 1 has eight apertures 6.

Figure 2:
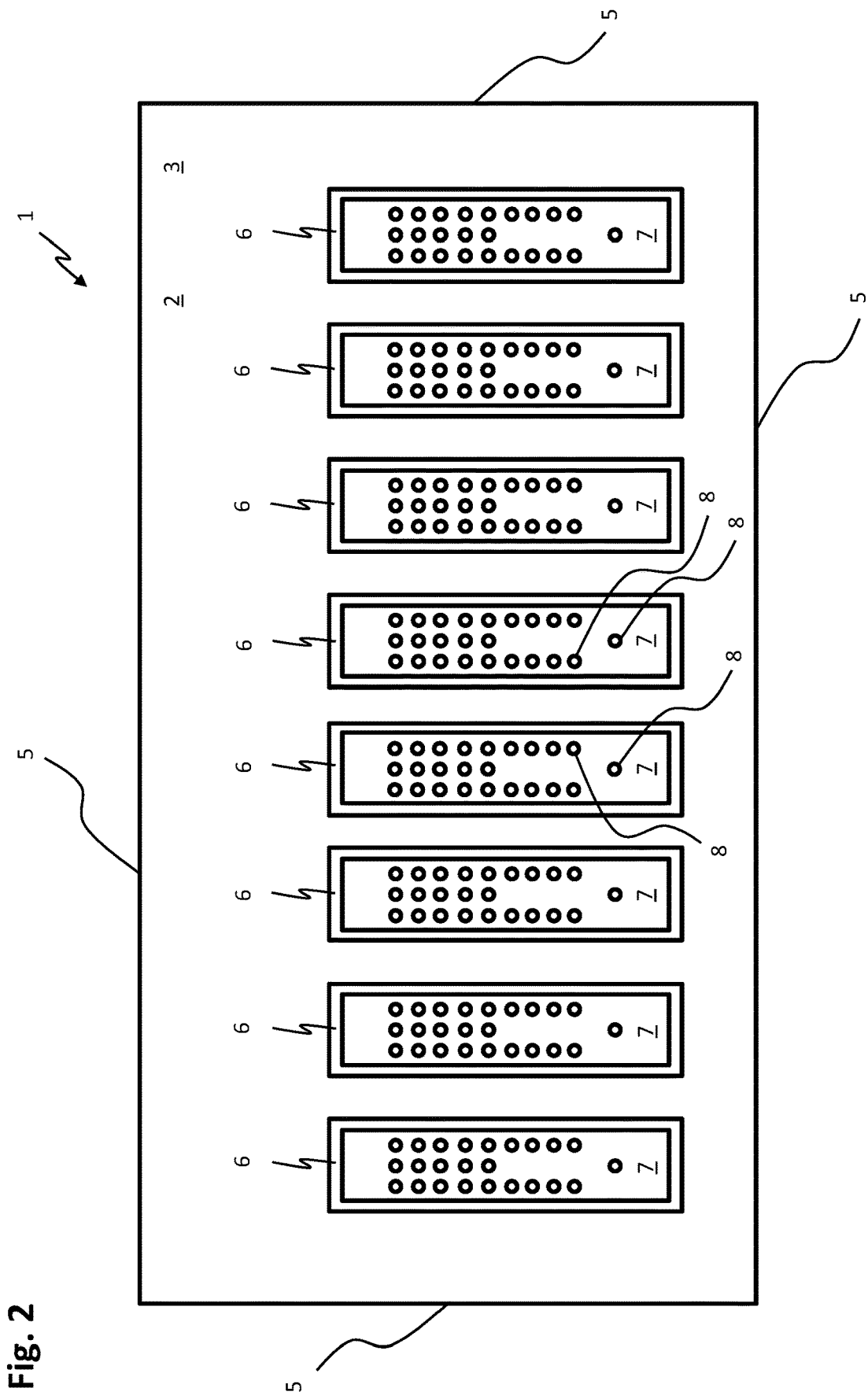
FIG. 2: the first base module of FIG. 1 in a top view.

FIG. 2 schematically shows the first base module 1 of FIG. 1 in a top view.

The first base module 1 has a plurality of connection elements 7. The connection elements 7 are arranged in the housing 2. Each connection element 7 is arranged in the area of an aperture 6. The connection elements 7 have contacts 8. As an example, each connection element 7 has twenty-four contacts 8. However, the connection elements 7 may also have a different number of contacts 8. An arrangement of the contacts 8 may differ from the arrangement shown as an example in FIG. 2. A size of the contacts 8 may also differ from the size of the contacts 8 indicated in FIG. 2. Contacts 8 may either be embodied as contact pins or as contact apertures, so that connection elements 7 may be embodied either as built-in plugs or built-in sockets. The connection elements 7 are embodied for a number of functional modules. The connection elements 7 are embodied to engage in module-connection elements of functional modules.

Figure 3:
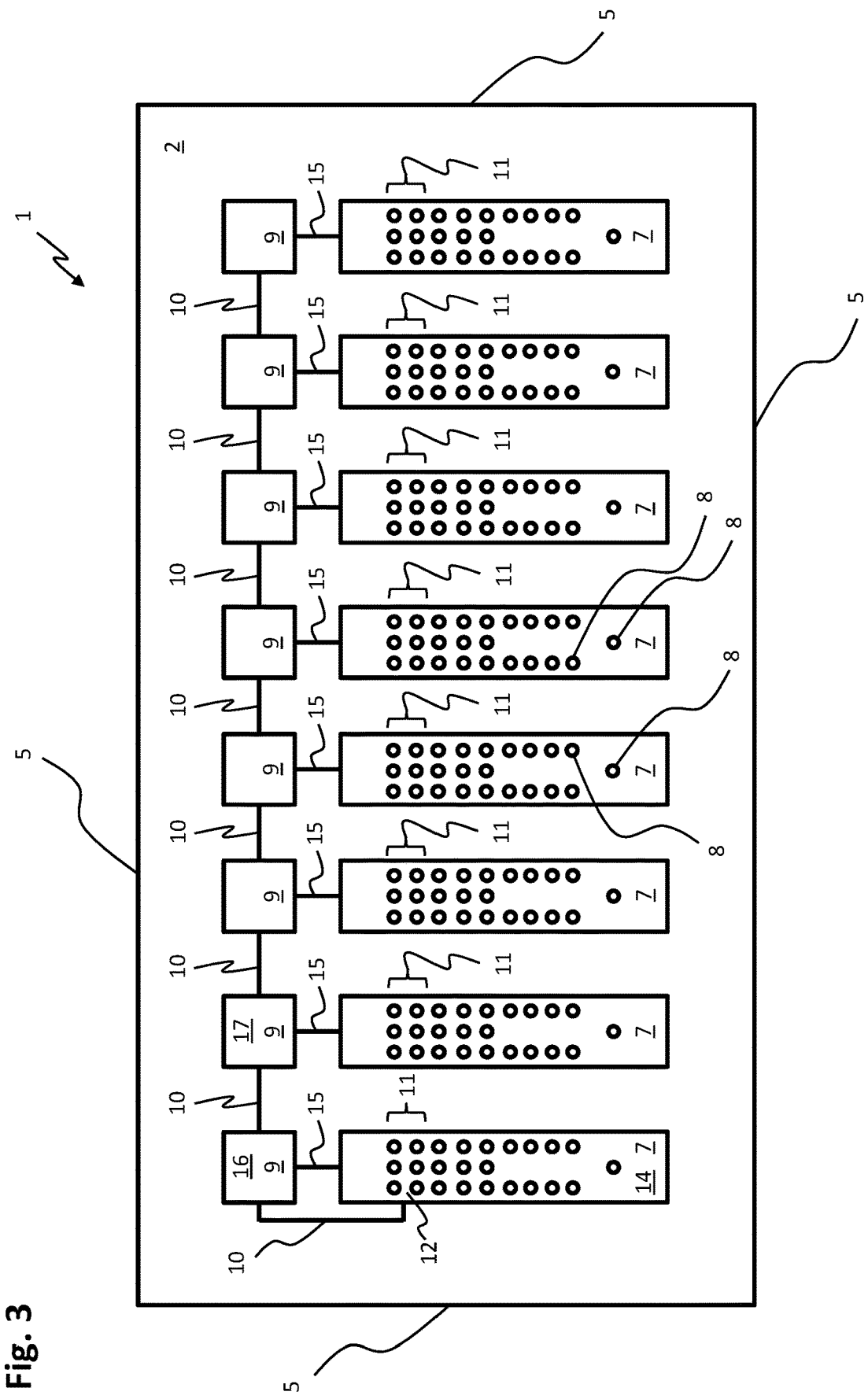
FIG. 3: elements arranged inside the first base module.

FIG. 3 schematically shows the first base module 1 in a top view, where the top side 3 of housing 2 is not represented, so that the elements arranged inside of housing 2 are visible.

The base module 1 comprises a plurality of communication units 9. The communication units 9 may e.g. be embodied as application specific integrated circuits (ASIC). In some examples, the communication units 9 may also be referred to as slaves. The communication units 9 are connected to each other via a data bus 10. As an example, the communication units 9 are serially connected to each other via the data bus 10. In this case, the communication units 9 form a network with a line topology. Other topologies, such as a tree topology and a star topology, are conceivable, as well.

Each connection element 7 has at least one data connection 11. The positions of the data connections 11 inside the connection elements 7 may differ from the positions shown in FIG. 3. For example, the data connections 11 may be used for exchanging EtherCAT protocol-based data between communication units 9 and functional modules. The data connections 11 for the EtherCAT protocol may, for example, each comprise six contacts 8. Two contacts 8 of each of the data connections 11 may be provided for differentially transmitting of EtherCAT telegrams. Two contacts 8 of each of the data pins 11 may be used for differentially receiving of EtherCAT telegrams. Two further contacts 8 of the data connections 11 may be provided as shielding contacts. Only one shielding contact may be provided for a data connection 11. The shielding contacts may also be omitted. The data connections 11 may also be provided for the exchange of data which are not based on the EtherCAT protocol but on another protocol. The data do not necessarily have to be transmitted differentially, instead the data connections 11 may also be embodied in such a way that serial or parallel transmission is possible. It is also possible that the data connections 11 are embodied in such a way that data may be transmitted via optical fibers.

The base module has a first field-bus connection 12. The first field-bus connection 12 is provided for connecting the communication units 9 to a field bus. For this purpose, the data bus 10 is connected to the first field-bus connection 12. The first field-bus connection 12 may, as shown in FIG. 3, be formed by the data connection 11 of a first connection element 14. The data connection 11 of the first connection element 14 is embodied to engage in a first module-data connection of a first module-connection element of a functional module. Via the first field-bus connection 12, for example, EtherCAT telegrams may be fed into the data bus 10 and the communication units 9. However, the first field-bus connection 12 does not necessarily have to be formed by the data connection 11 of the first connection element 14. The first field-bus connection 12 may also be arranged or, respectively, embodied at another position on the housing 2.

Each communication unit 9 is connected to at least one data connection 11 of a connection element 7. The communication units 9 are connected to the data connections 11 via data lines 15. Via the data lines 15, the communication units 9 may e.g. exchange EtherCAT data with functional modules. Not every data connection 11 of a connection element 7 has to be connected to a communication unit 9. If, for example, the field-bus connection 12 is formed by the data connection 11 of the first connection element 14, a first communication unit 16 for the first connection element 14 may also be omitted. If, however, the first communication unit 16 is provided in the base module 1, the first communication unit 16 may transmit data which are fed into the first communication unit 16 via data connection 11 of the first connection element 14 forming the first field-bus connection 12 and into the data bus 10, to a second communication unit 17, without, however, processing the fed-in data itself. However, the first communication unit 16 may also be connected to at least a second data connection of the first connection element 14 for communication with a functional module. The second data connection may be embodied as an SPI connection (Serial Peripheral Interface, SPI), for example. The second data connection and other exemplary data connections are explained in more detail in the description of FIG. 9.

Figure 4:
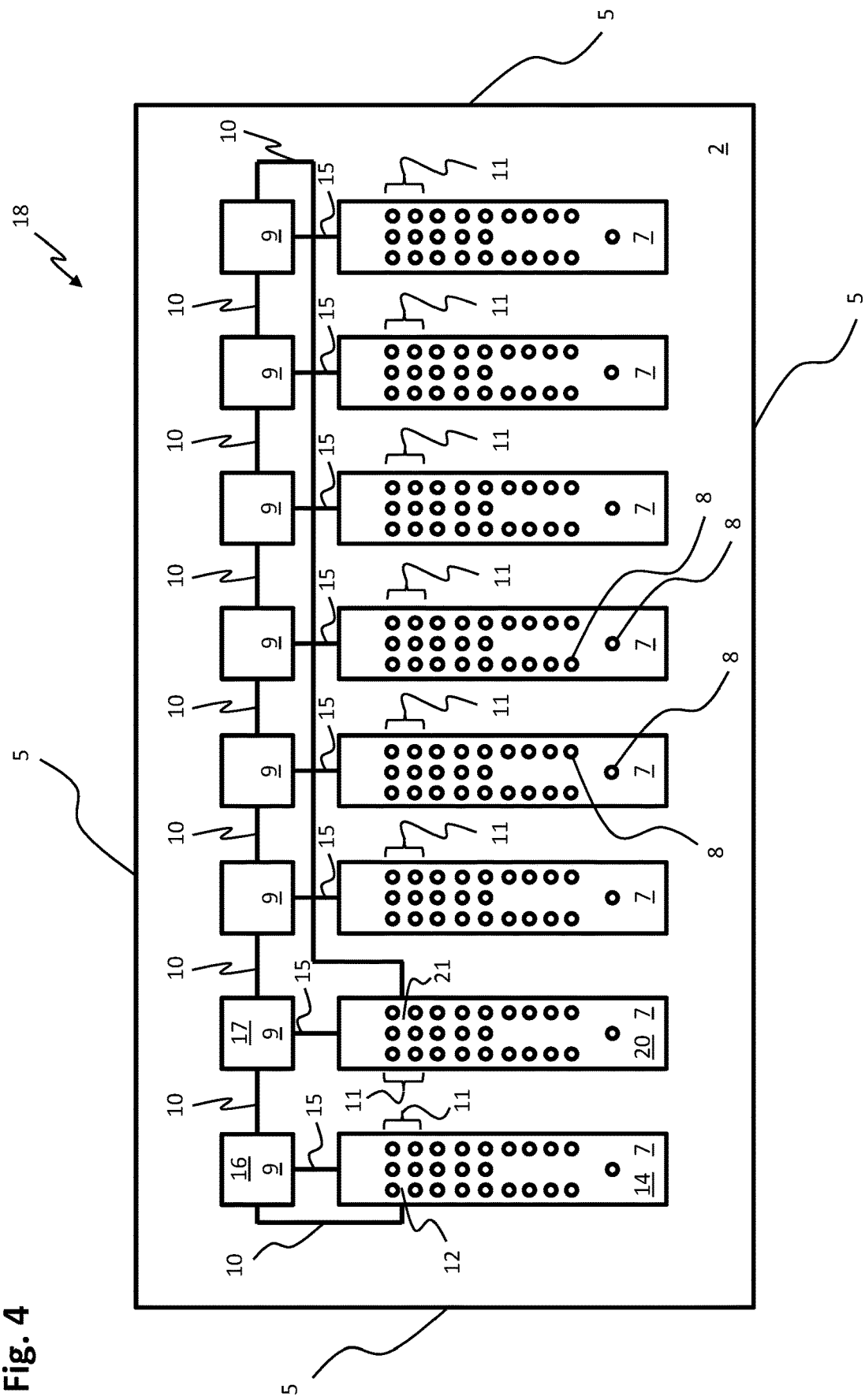
FIG. 4: a second base module according to a second embodiment.

FIG. 4 schematically shows a second base module 18 according to a second embodiment in a top view. The second base module 18 according to the second embodiment shows similarities with the first base module 1 according to the first embodiment. Similar or identical elements have the same reference numerals. In the following description, differences are described. The top side 3 of housing 2 is not represented, so that the elements which are arranged inside of the housing 2 are visible.

In the second base module 18 according to the second embodiment, a data connection 11 of a second connection element 20 forms a second field-bus connection 21. The data bus 10 is connected to the second field-bus connection 21.

The data connection 11 of the second connection element 20 is embodied to engage in a first module-data connection of a second module-connection element of a functional module. The data bus 10 forms a ring between the first field-bus connection 12 and the second field-bus connection 21. The communication units 9 are connected to the data bus 10 between the first and the second field-bus connection 12, 21. The first communication unit 16 and the second communication unit 17 may also be omitted. If the first and the second communication units 16, 17 are provided in the second base module 18, the first communication unit 16 may be connected at least to the second data connection of the first connection element 14 and the second communication unit 17 at least to a second data connection of the second connection element 20, which may e.g. be embodied as an SPI connection.

The second field-bus connection 21 may e.g. be provided for redundant feeding of data into the data bus 10. For example, EtherCAT telegrams may be fed in via the second field-bus connection 21. Due to the redundant feed-in of data via the second field-bus connection 21, all other intact communication units 9 may still be addressed in the event of a defect in a communication unit 9. All further intact communication units 9 which are located between the first field-bus connection 12 and the defective communication unit 9 may be addressed via the first field-bus connection 12. All further, intact communication units 9, which are arranged between the defective communication unit 9 and the second field-bus connection 21, may be addressed via the second field-bus connection 21.

Data supplied via the first field-bus connection 12 may be forwarded via the second field-bus connection 21. For this reason, the second field-bus connection 21 may also be used, for example, to feed in data fed into the second base module 18 via the first field-bus connection 12 into an additional first base module 1 according to the first embodiment or into an additional second base module 18 according to the second embodiment via the second field-bus connection 21. The second field-bus connection 21 may therefore be used to connect two base modules 1, 18.

Alternatively, the second field-bus connection 21 may also be formed by a data connection of another connection element 7, e.g. by a data connection of the first connection element 14.

Figure 5:
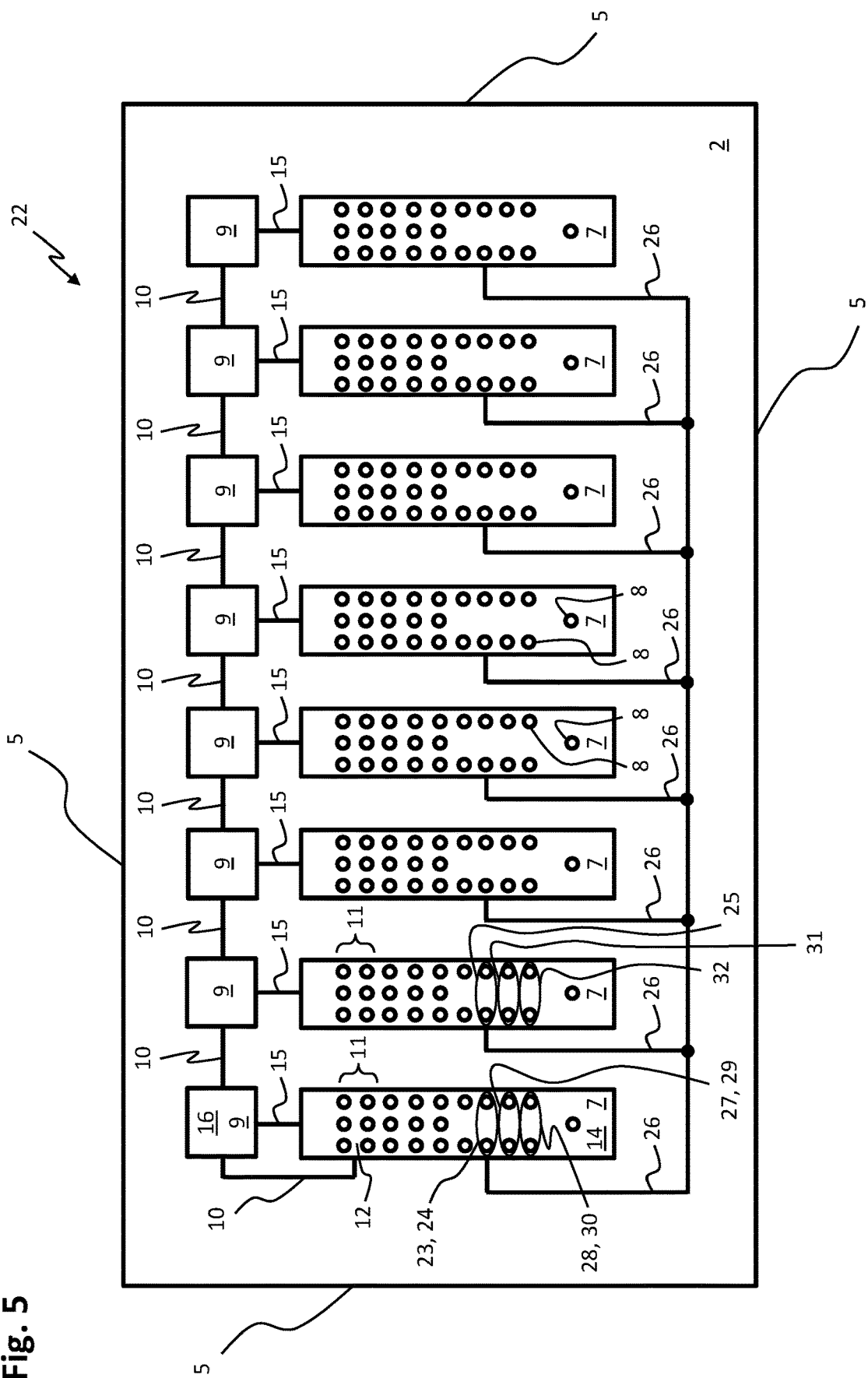
FIG. 5: a third base module according to a third embodiment form.

FIG. 5 schematically shows a third base module 22 according to a third embodiment in a top view. The third base module 22 according to the third embodiment e.g. comprises the elements of base module 1 according to the first embodiment and additional elements. Similar or identical elements have the same reference numerals. However, the third base module 22 according to the third embodiment may also comprise the elements of the second base module 18 according to the second embodiment and the additional elements. In the following description, additional elements are described. The top side 3 of housing 2 is not represented, so that the elements which are arranged inside housing 2 are visible.

In the third base module 22 according to the third embodiment, a first voltage connection 23 of one of the connection elements 7 forms a first supply connection 24 for feeding a first supply voltage into the third base module 22. FIG. 5 exemplarily shows that the first supply connection 24 is provided at the first connection element 14. The first supply connection 24 may e.g. be provided for feeding in a DC voltage of 24 V. At least one of the remaining connection elements 7 comprises a further first voltage connection 25 for forwarding the first supply voltage to a functional module. In FIG. 5 the further first voltage connection 25 is shown for one connection element 7 only. Of course, all other connection elements 7 may also have a further first voltage connection 25, except for the first connection element 14. The first supply connection 24 is connected to the further first voltage connections 25 by a supply line 26. For the sake of simplicity, FIG. 5 shows the supply line 26 connected to a contact 8 of the first supply connection 24 and each connected to a contact 8 of a further first voltage connection 25. A ground path of the supply line 26 is connected to a further contact 8 of the supply connection 24 or to a further contact 8 of the other first voltage connections 25.

Alternatively, the first supply connection may also be arranged or, respectively, embodied at another location on housing 2. In this case at least a connection element 7 and/or the first connection element 14 has a further first voltage connection 25 for forwarding the first supply voltage to a functional module.

The third base module 22 may also have further supply connections 27, 28. For instance, the third base module 22 may have a total of three supply connections 24, 27, 28. A second supply connection 27 and a third supply connection 28 may e.g. each be formed by a second voltage connection 29 and a third voltage connection 30 of one of the connection elements 7. FIG. 5 shows this as an example for the first connection element 14. At least one of the remaining connection elements 7 then comprises a further second voltage connection 31 for forwarding a second supply voltage to a functional module and at least one of the remaining connection elements 7 comprises a further third voltage connection 32 for forwarding a third supply voltage to a functional module. FIG. 5 exemplarily shows the further second voltage connection 31 and the further third voltage connection 32 for only a connection element 7. Of course, all other connection elements 7 may also have a further second voltage connection 31 and a further third voltage connection 32, except for the first connection element 14. For simplicity, supply lines connect between the second supply connection 27 and the further second voltage connection 31 or between the third supply connection 28 and the further third voltage connection 32.

The second supply connection 27 may be used for switched feed-in of a DC voltage of 24 V. The third supply connection 28 may e.g. be provided for feeding in a DC voltage of 48 V. However, the supply voltages do not necessarily have to be DC voltages. Apart from extra-low voltages, low voltages may also be fed into the third base module 22 as supply voltages. The supply voltages may be forwarded to functional modules via the further voltage connections 25, 31, 32. The supply voltages may then be made available to subscribers in the field, such as sensors and actuators, for their operation via the functional modules. However, the second and third supply connections 27, 28 and the further second and third voltage connections 31, 32 may also be omitted.

Figure 6:
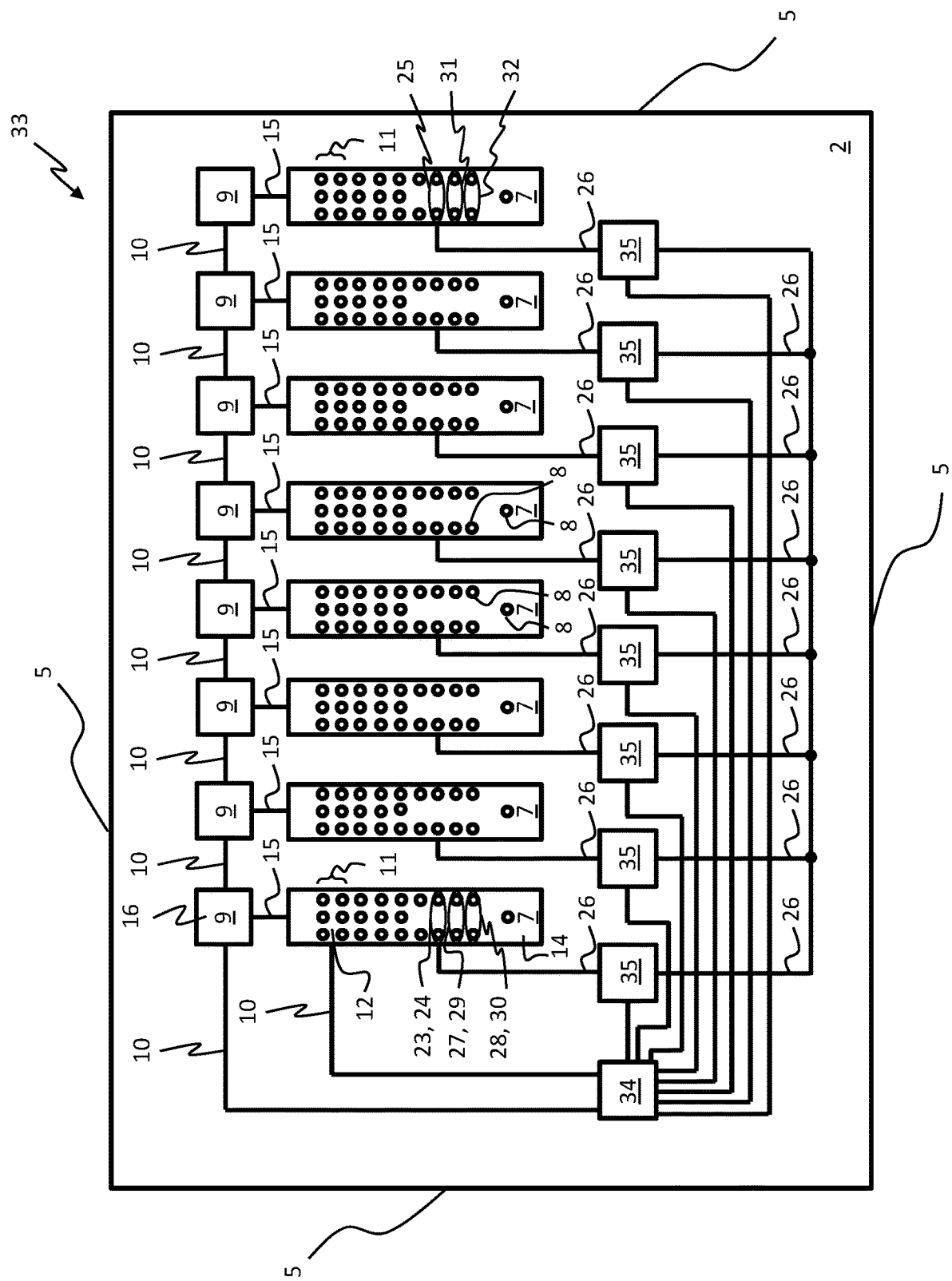
FIG. 6: a fourth base module according to a fourth embodiment.

FIG. 6 schematically shows a fourth base module 33 according to a fourth embodiment in a top view. The fourth base module 33 according to the fourth embodiment comprises the elements of the third base module 22 according to the third embodiment and additional elements. Similar or identical elements have the same reference numerals. In the following description, additional elements are described. The top side 3 of housing 2 is not represented so that the elements which are arranged inside housing 2 are visible.

The fourth base module 33 according to the fourth embodiment has a safety device 34 connected to the data bus

10. The safety device 34 is at least connected to a safety circuit 35. FIG. 6 shows as an example that the safety device 34 is connected to one safety circuit 35 per connection element 7. The safety circuits 35 are each connected to the first supply connection 24 via the supply line 26. The safety circuits 35 are connected to the further first voltage connections 25 for safely transmitting the first supply voltage to a functional module.

The safety circuit 34 may, for example, detect the first supply voltage and is embodied to evaluate the detected data. The safety circuits 35 may, for example, have field-effect transistors which may be controlled by the safety device 34. If the safety device 34 determines, for example, that the first supply voltage is outside a predetermined value range, the safety device 34 may control the field effect transistors of the safety circuits 35 in such a way that the first supply voltage cannot be passed on. With the safety device 34 and the field effect transistors, it is also possible to forward the first supply voltage in a switched mode.

In FIG. 6, the safety device 34 is exemplarily connected to the data bus 10 between the first field-bus connection 12 and the communication units 9. However, the safety device 34 may also be connected to the data bus 10 at another position. For example, the safety device 34 may be connected to the data bus 10 between two communication units 9.

For the sake of clarity the safety circuits 35 for safely forwarding the first supply voltage are shown in FIG. 6. However, additional safety circuits 35 for the safe transmission of the second and third supply voltage may also be provided. For safe forwarding of the second supply voltage, at least one additional safety circuit 35 must be connected to the second supply connection 27 and to a further second voltage connection 31. For the safe forwarding of the third supply voltage, at least one additional safety circuit 35 is to be connected to the third supply connection 28 and to a further third voltage connection 31. However, the additional safety circuits 35 may also be omitted.

Figure 7:
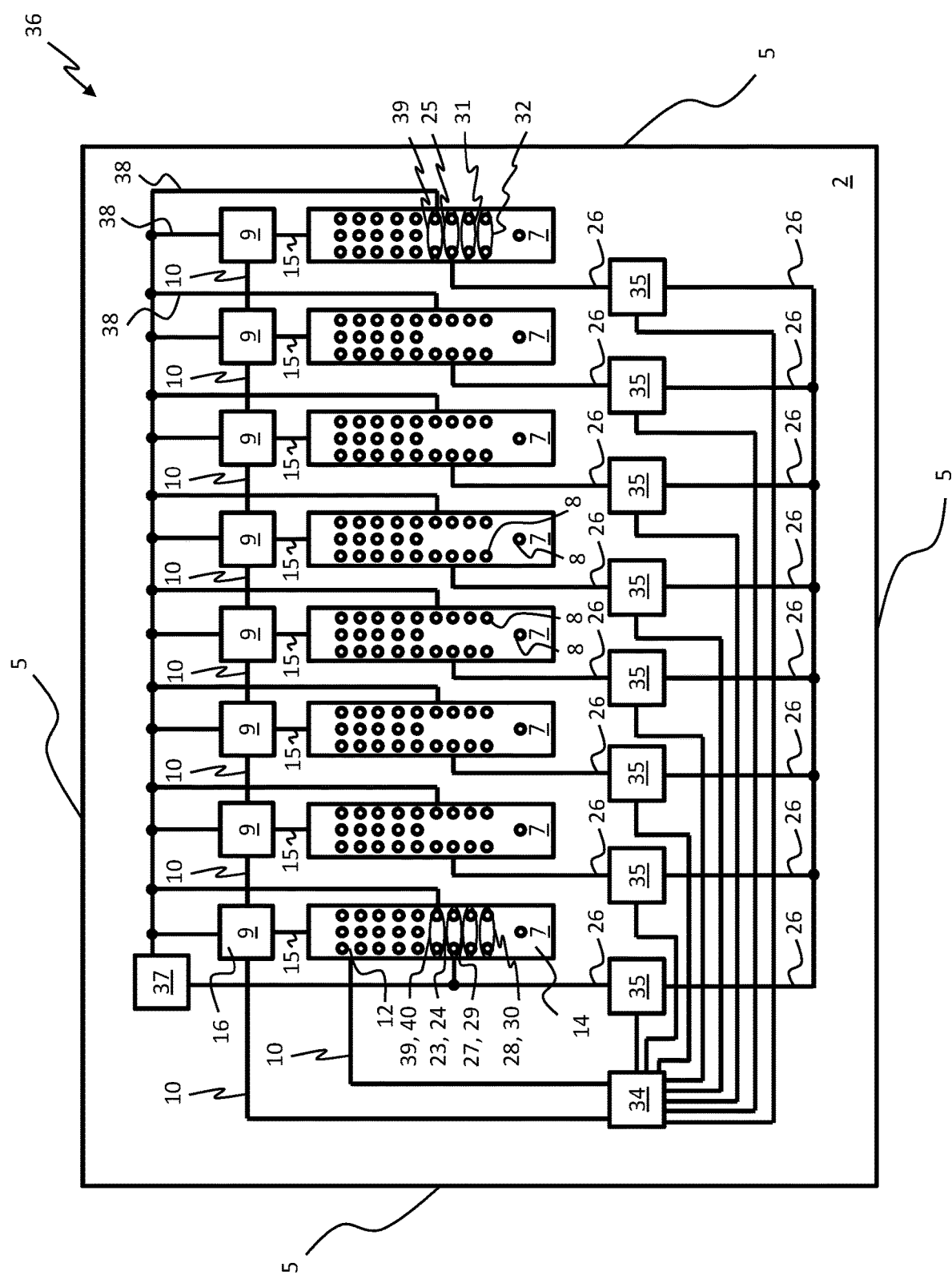
FIG. 7: a fifth base module according to a fifth embodiment.

FIG. 7 schematically shows a fifth base module 36 according to a fifth embodiment in a plan view. The fifth base module 36 according to the fifth embodiment has the elements of the fourth base module 33 according to the fourth embodiment and additional elements. Similar or identical elements have the same reference numerals. In the following description additional elements are described. The top side 3 of housing 2 is not represented, so that the elements which are arranged inside of housing 2 are visible.

The first supply connection 24 is connected to a converter 37. The converter 37 is connected to each communication unit 9 via a bus-supply line 38. For the sake of simplicity, there is a ground path of the bus-supply line 38. The converter 37 is embodied to generate a bus voltage from the first supply voltage for operation and to provide it to the communication units 9. The bus voltage may, for example, be a DC voltage of 3.3 V.

At least one of the communication units 7 has a bus-voltage connection 39 for forwarding the bus voltage to a functional module. FIG. 7 exemplarily shows that the first connection element 14 and the rightmost connection element 7 each have a bus-voltage connection 39. However, all connection elements 7 may also have a bus-voltage connection 39. The converter 37 is connected to the bus-voltage connections 39. This means that the bus voltage may be passed on to functional modules via the bus-voltage connections 39. In a functional module, the bus voltage may, for example, be made available to further communication units or, for example, a microcontroller for operation. However, the converter 37 does not necessarily have to be connected to the bus connections 39 if this is not practical.

Alternatively, a bus-voltage connection 39 of one of the connection elements 7 may form a bus-supply connection 40 for feeding the bus voltage into the fifth base module 36 for operation of the communication units 9. FIG. 7 exemplarily shows that the bus-supply connection 40 is formed by the bus-voltage connection 39 of the first connection element 14. In this case, the converter 37 may be omitted and each communication unit 9 is connected to the bus-supply connection 40 via the bus-supply line 38. The bus voltage may, for example, be provided by a functional module and fed into the fifth base module 36 via the bus-supply connection 40. In addition, the bus-supply connection 40 may be connected to at least one bus-voltage connection 39 of the other connection elements 9.

Instead of a converter 37, the fifth base module 36 may also have a plurality of converters 37. For example, one converter 37 may be arranged in the fifth base module 36 for each group of communication units 9.

Figure 8:
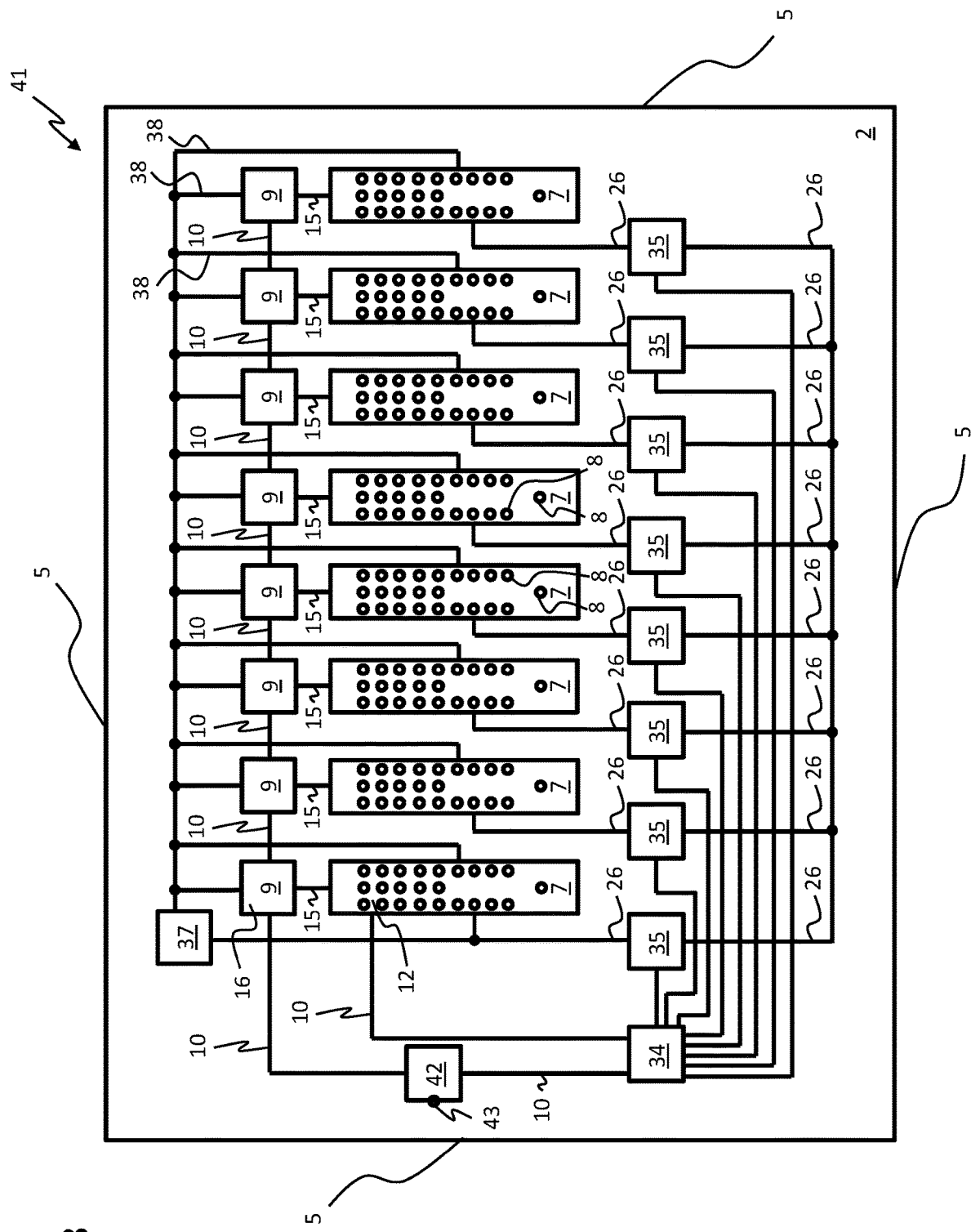
FIG. 8: a sixth base module according to a sixth embodiment.

FIG. 8 schematically shows a sixth base module 41 according to a sixth embodiment in a top view. The sixth base module 41 according to the sixth embodiment has, for example, the elements of the fifth base module 36 according to the fifth embodiment and additional elements. Similar or identical elements have the same reference numerals. However, the sixth base module 41 according to the sixth embodiment may also have the elements of the first base module 1 according to the first embodiment, the second base module 18 according to the second embodiment, the third base module 22 according to the third embodiment or the fourth base module 33 according to the fourth embodiment and the additional elements. In the following description additional elements are described. The top side 3 of housing 2 is not represented so that the elements which are arranged inside housing 2 are visible.

In the sixth base module 41 according to the sixth embodiment, a monitoring unit 42 is connected to the data bus 10. The monitoring unit 42 is in FIG. 8 exemplarily connected to the data bus 10 between the safety device 34 and the communication units 9. However, the monitoring unit 42 may also be connected to the data bus 10 at another position. For example, the monitoring unit 42 may be connected to the data bus 10 between the first field-bus connection 12 and the safety device 34 or between two communication units 9.

The monitoring unit 42 is embodied to monitor at least one parameter relating to the sixth base module 41. The parameter may e.g. be a temperature inside of the housing 2, a temperature in an environment of the sixth base module 41, a pressure, a humidity, an inclination of the sixth base module 41 or an acceleration of the sixth base module 41. For this purpose, the monitoring unit 42 comprises at least a sensor connection 43. A sensor may be connected to the sensor connection 43 which records the parameter.

Figure 9:
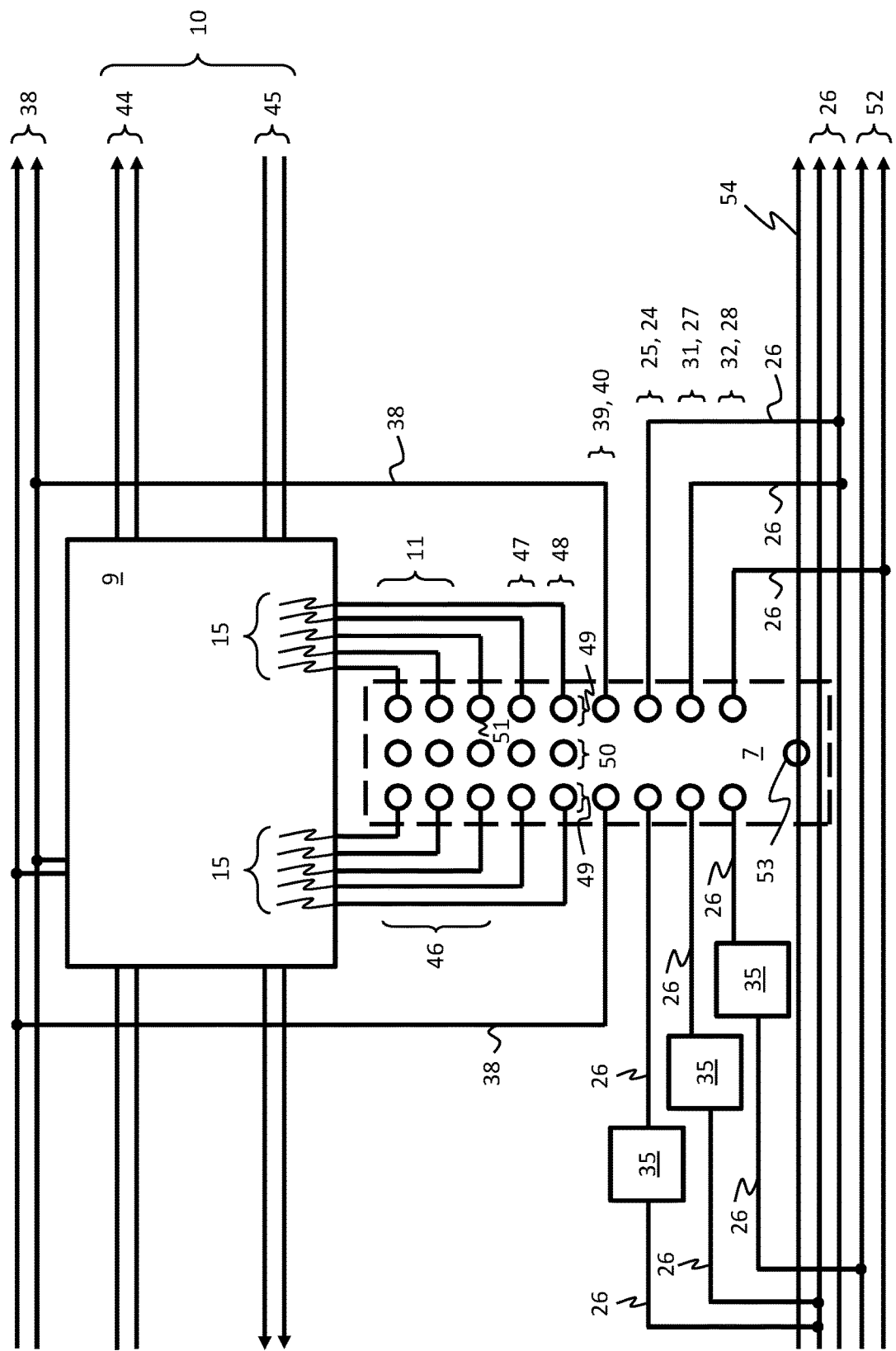
FIG. 9: a detailed view of the connections of a communication unit and a connection element of a base module.

FIG. 9 schematically shows a detailed representation of the connections of a communication unit 9 and a connector element 7 of the sixth base module 41. The connections and contacts of the communication unit 9 and the connection element 7 which are shown and described may be transferred analogously to the first base module 1 according to the first embodiment, the second base module 18 according to the second embodiment, the third base module 22 according to the third embodiment, the fourth base module 33 according to the fourth embodiment or the fifth base module 36 according to the fifth embodiment, wherein the connections and contacts which are not required in the respective embodiment may be omitted or not used.

The communication unit 9 is connected to the bus-supply line 38. In the detailed depiction of FIG. 9, the bus-supply line 38 is shown with its ground path. The communication unit 9 is furthermore connected to the data bus 10. The data bus 10 comprises two channels 44, 45 for a bidirectional exchange of data with other communication units 9. The first and the second channel 44, 45 of the data bus 10 are each represented by a double arrow in FIG. 9.

The connection element 7 e.g. comprises four data connections 11, 46, 47, 48. An arrangement of the data connections 11, 46, 47, 48 may differ from the arrangement shown in FIG. 9. The assignment of the contacts is not fixed, either, but may be changed. Three of the four data connections 11, 46, 47, 48 may also be omitted.

The first data connection 11 is embodied as EtherCAT connection with four signal contacts 49 and two optional shielding contacts 50.

The second data connection 46 is embodied as an SPI connection. An SPI connection has a total of five signal contacts 49, which may be designated as SEL, CLK, DI, DO, and IRQ contacts. The IRQ contact embodied as an interrupt input may also be omitted. The SEL contact and the DO contact and/or the DI contact may also be omitted. An additional sixth contact 51 may be used to query whether an electrically erasable programmable read-only memory (EEPROM) of a functional module is ready for operation. For every two signal contacts 49, the SPI connection 46 may also have a shielding contact 50. However, only one shield contact 50 may be sufficient. However, the shield contacts 50 may also be omitted in the SPI connection. In addition to the SPI connection, connector 7 may also have a QSPI connection (queued SPI).

The first data connection 11 provided for communication via EtherCAT and the second data connection 46 provided for communication via SPI have four shared signal contacts 49 and two shared shield contacts 50 in the example shown in FIG. 9. The two shared shielding contacts 50 may be omitted. The first data connection 11 and the second data connection 46 do not necessarily have to have shared signal contacts 49 and shared shield contacts 50.

A third data connection 47 having two signal contacts 49 and an optional shielding contact 50 is provided for communication of the communication unit 9 with an electrically erasable programmable read-only memory (EEPROM) arranged in a functional module. The third connection 47 may also be described as an I2C connection (inter-integrated circuit connection). One of the signal contacts 49 may also be used to query the operational readiness of the EEPROM.

A fourth data connection 48 is provided for transmitting the synchronization signals. A first signal contact 49 of the fourth data connection 48 may be referred to as a latch 0 contact. A second signal contact 49 of the fourth data connection 48 may be referred to as a latch 1 contact. The fourth data connection 48 also includes an optional shield contact 50.

The connection element 7 comprises the bus-voltage connection 39 which may also be provided as bus-supply connection 40. Contrary to the depiction in FIG. 9, the bus-voltage connection 39 does not necessarily have to be connected to the bus-supply line 38.

Furthermore, the connection element 7 comprises the further first, the further second and the further third voltage connection 25, 31, 32, which may each be provided either as first, second and third supply connection 24, 27, 28 or for forwarding the first, second and third supply voltage to a functional module.

As an example, in addition to the further first voltage connection 25, the further second voltage connection 31 is connected to supply line 26, as well. In the detailed illustration in FIG. 9, the supply line 26 is shown with its ground path. However, a separate supply line may also be provided for the second voltage connection 31. The further third voltage connection 32 is connected to a further supply line 52.

As an option, the connection element 7 has a protective contact 53 which is connected to a protective conductor system 54 and serves to protect against electric shock.

The further first, the further second, the further third voltage connection 25, 31, 32, the bus-voltage connection 39, the supply line 26, the further supply line 52 and the safety circuits 35 shown in FIG. 9 may also be omitted.

Figure 10:
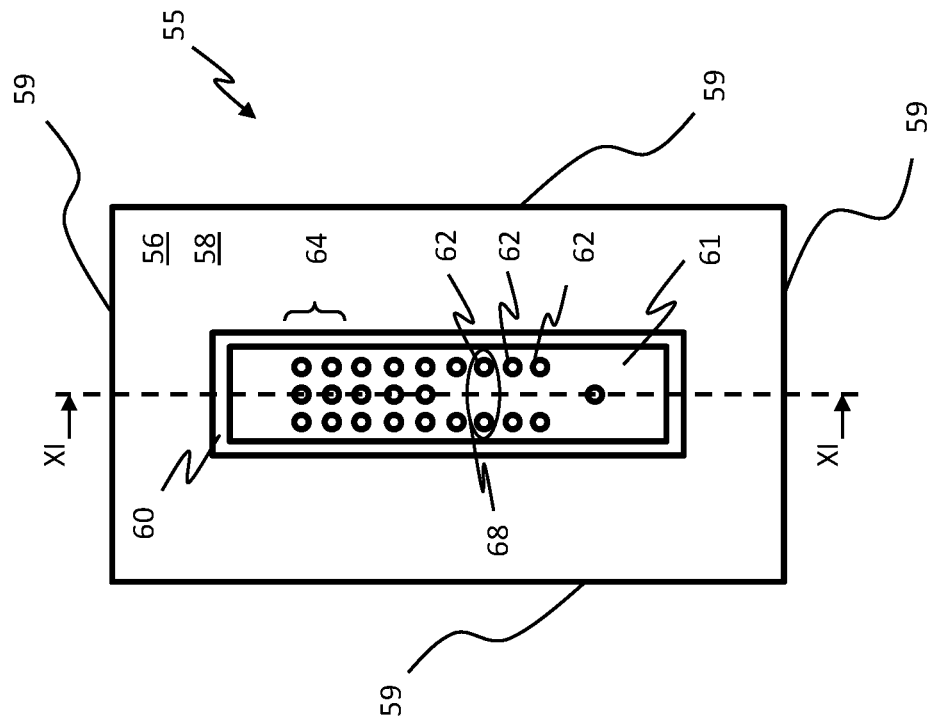
FIG. 10: a functional module for a switch-cabinet system in a view from below.

FIG. 10 schematically shows a functional module 55 for a switch-cabinet system in a bottom view.

The functional module 55 has a module housing 56. The module housing 56 may completely or at least in some areas consist of a metallic material, for example aluminum. However, any other material is conceivable. The module housing 56 comprises a top side 57 which is not visible here, a bottom side 58 opposite to the top side 57 and four side walls 59. The bottom side 58 of the module housing 56 has an aperture 60.

The functional module 55 comprises a first module-connection element 61. The first module-connection element 61 is partly arranged in the module housing 56. The first module-connection element 61 is located in the area of aperture 60 and protrudes from aperture 60. The first modular connection element 61 has contacts 62. As an example, the first modular connection element 61 has twenty-four contacts 62. However, the first module-connection element 61 may also have a different number of contacts 62. The contacts 62 of the first module-connection element 61 may be embodied either as contact pins or as contact apertures, so that the first module-connection element 61 may be embodied either as a built-in plug or as a built-in socket. The first module-connection element 61 is embodied to engage in a connection element 7 of the first base module 1 according to the first embodiment, the second base module 18 according to the second embodiment, the third base module 22 according to the third embodiment, the fourth base module 33 according to the fourth embodiment, the fifth base module 36 according to the fifth embodiment or the sixth base module 41 according to the sixth embodiment in accordance with the above description of FIGS. 1 to 9.

Figure 11:
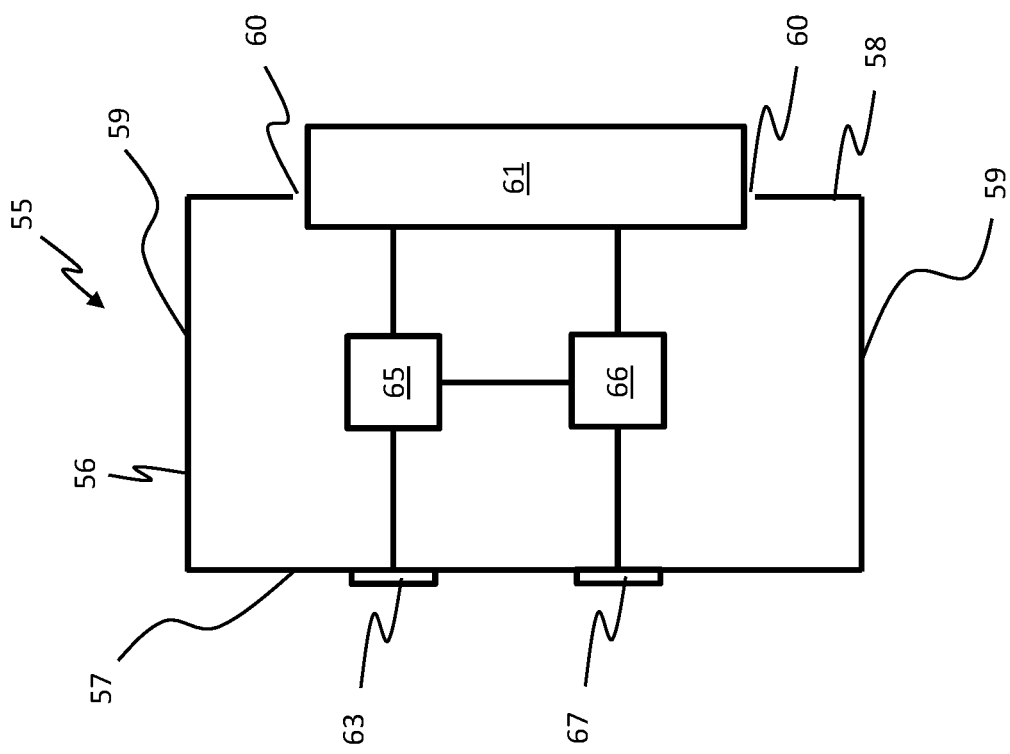
FIG. 11: the functional module of FIG. 10 in a cross-sectional view.

FIG. 11 schematically shows functional module 55 of FIG. 10 in a cross-sectional view of a plane XI-XI shown in FIG. 10, which is indicated by a dashed line.

Functional module 55 is embodied as a feed-in module and comprises a first field-bus-module connection 63. The first field-bus-module connection 63 is arranged on the top side 57 of the module housing 56. The first module-connection element 61 comprises a first module-data connection 64 as shown in FIG. 10. The first field-bus-module connection 63 is connected to the first module-data connection 64. The first module-data connection 64 is provided to access the first data connection 11 of the first connection element 14 of the first module 1 according to the first embodiment, the second module 18 according to the second embodiment, the third module 22 according to the third embodiment, the fourth module 33 according to the fourth embodiment, the fifth module 36 according to the fifth embodiment or the sixth module 41 according to the sixth embodiment, which forms the first field-bus connection 12.

According to an embodiment, the functional module 55 may have a further communication unit 65. The further communication unit 65 is connected to the first field-bus-module connection 63 and to the module-data connection 64. The further communication unit 65 is also connected to an electronic circuit 66. The electronic circuit 66 may include, for example, switches, fuses, a lightning protection, a mains filter, a contactor, a line choke, a current and voltage meter and/or a power-supply unit. The additional communication unit 65 may, for example, be connected to the power-supply unit of the electronic circuit 66 in order to control the power-supply unit. However, the further communication unit 65 may also be omitted. In this case, for example, the first communication unit 16 of the first base module 1 may be connected according to the first embodiment, the second base module 18 according to the second embodiment, the third base module 22 according to the third embodiment, the fourth base module 33 according to the fourth embodiment, of the fifth base module 36 according to the fifth embodiment or of the sixth base module 41 according to the sixth embodiment, for example to be connected via an SPI connection 46 of the first connection element 14 and via a corresponding SPI-module connection of the first module-connection element 61 to the power-supply unit of the functional module 55 in order to drive it.

The functional module 55 comprises a module-supply connection 67 for feeding a supply voltage into the functional module 55. The module-supply connection 67 is connected to a voltage connection 68 of the first module-connection element 61 shown in FIG. 10 for passing on the supply voltage to the first base module 1 according to the first embodiment, the second base module 18 according to the second embodiment, the third base module 22 according to the third embodiment, the fourth base module 33 according to the fourth embodiment, the fifth base module 36 according to the fifth embodiment or the sixth base module 41 according to the sixth embodiment. The module-supply connection 67 is connected to the electronic circuit 66, while the electronic circuit 66 is connected to the voltage connection 68. The voltage connection 68 is embodied to engage with a supply connection 24, 27, 28 of the first base module 1 according to the first embodiment, the second base module 18 according to the second embodiment, the third base module 22 according to the third embodiment, the fourth base module 33 according to the fourth embodiment, the fifth base module 36 according to the fifth embodiment or the sixth base module 41 according to the sixth embodiment. However, the electronic circuit 66, the module-supply connection 67 and the voltage connection 68 may also be omitted. In the arrangement of the voltage connection 68 exemplarily selected in FIG. 10, it would engage with the first supply connection 24.

The first field-bus-module connection 63 and the module-supply connection 67 may optionally form a shared connection. Via the shared connection, data and supply voltages may be fed into the functional module 55. In this case the functional module 55 has a decoupling device. The decoupling device is connected to the shared connection, to the first module-data connection 64 and to the voltage connection 68 of the first module-connection element 61. The decoupling device is embodied to decouple the data and supply voltages fed into the functional module 55 via the shared connection. For example, both EtherCAT data and two supply voltages may be transferred on a four-wire cable. These may be decoupled from each other by the decoupling device, so that data and supply voltages may be fed into the respective base module separately from each other via the first module-connection element 61 and a connection element 7 of the first base module 1 according to the first embodiment, of the second base module 18 according to the second embodiment, of the third base module 22 according to the third embodiment, of the fourth base module 33 according to the fourth embodiment, of the fifth base module 36 according to the fifth embodiment or of the sixth base module 41 according to the sixth embodiment.

In embodiments herein, the functional module 55 may have a second field-bus-module connection and a second module-connection element. The second module-connection element has a first module-data connection. The second field-bus-module connection is connected to the first module-data connection of the second module-connection element. The first module-data connection of the second module-connection element of the functional module 55 is embodied to engage with a first data connection 11 of the second connection element 20 of the second base module 18, which according to the second embodiment forms the second field-bus connection 21.

Figure 12:
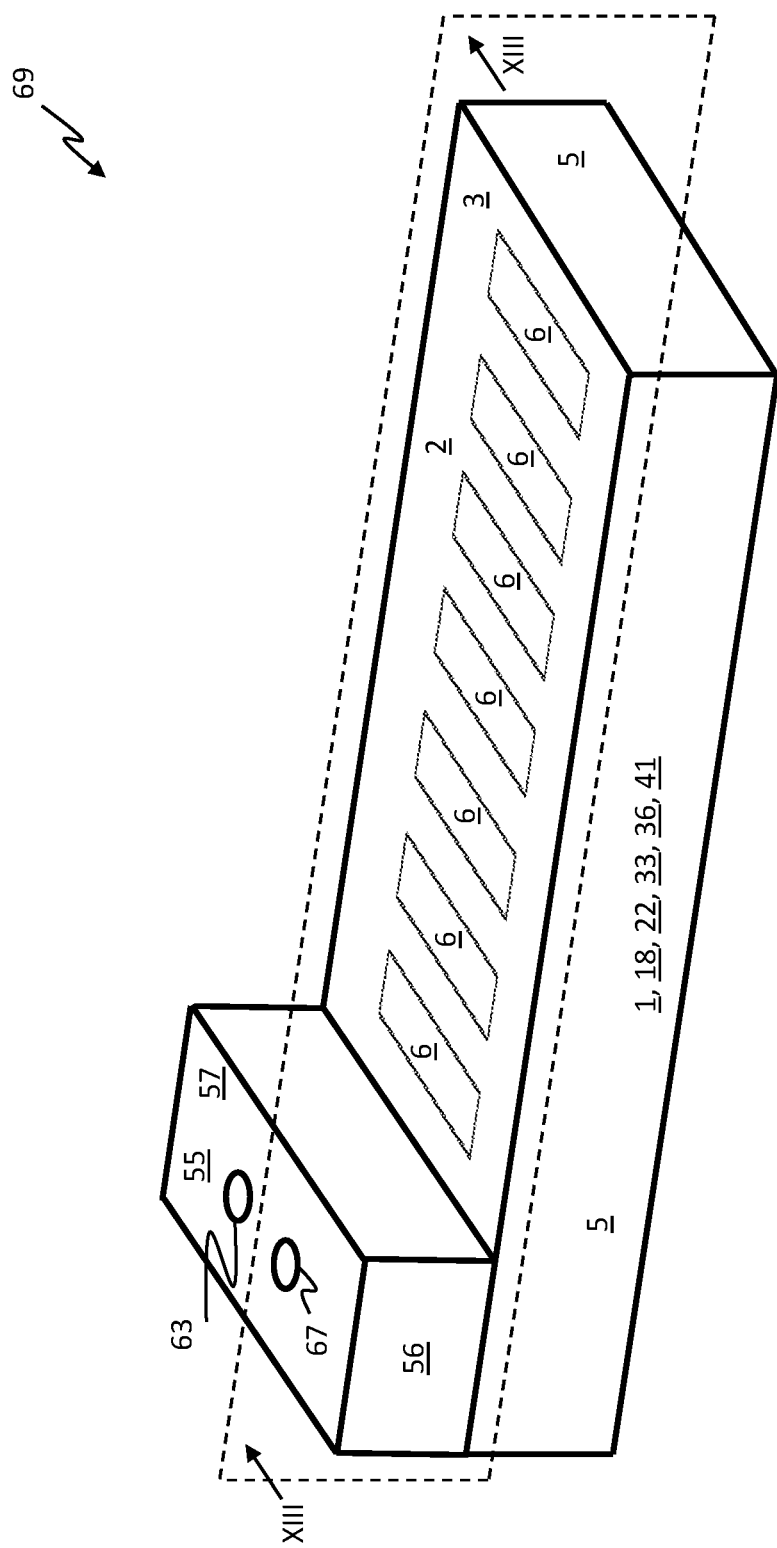
FIG. 12: a perspective view of a switch-cabinet system with a base module and a feed-in module.

FIG. 12 schematically shows a perspective view of a switch-cabinet system 69 having the base module 1, the second base module 18, the third base module 22, the fourth base module 33, the fifth base module 36 or the sixth base module 41 according to one of the six embodiments described in FIGS. 1 to 9 and the functional module 55 embodied as a feed-in module. For the sake of clarity, the system is in the following described in context with the base module 1 according to the first embodiment. The description then applies analogously to the second base module 18, the third base module 22, the fourth base module 33, the fifth base module 36 and the sixth base module 41.

The bottom side 58 of the module housing 56 of the functional module 55 is in contact with a part of the top side 3 of the housing 2 of base module 1. The first module-connection element 61 of the functional module 55 thereby engages with the first connection element 14 of the base module 1.

Figure 13:
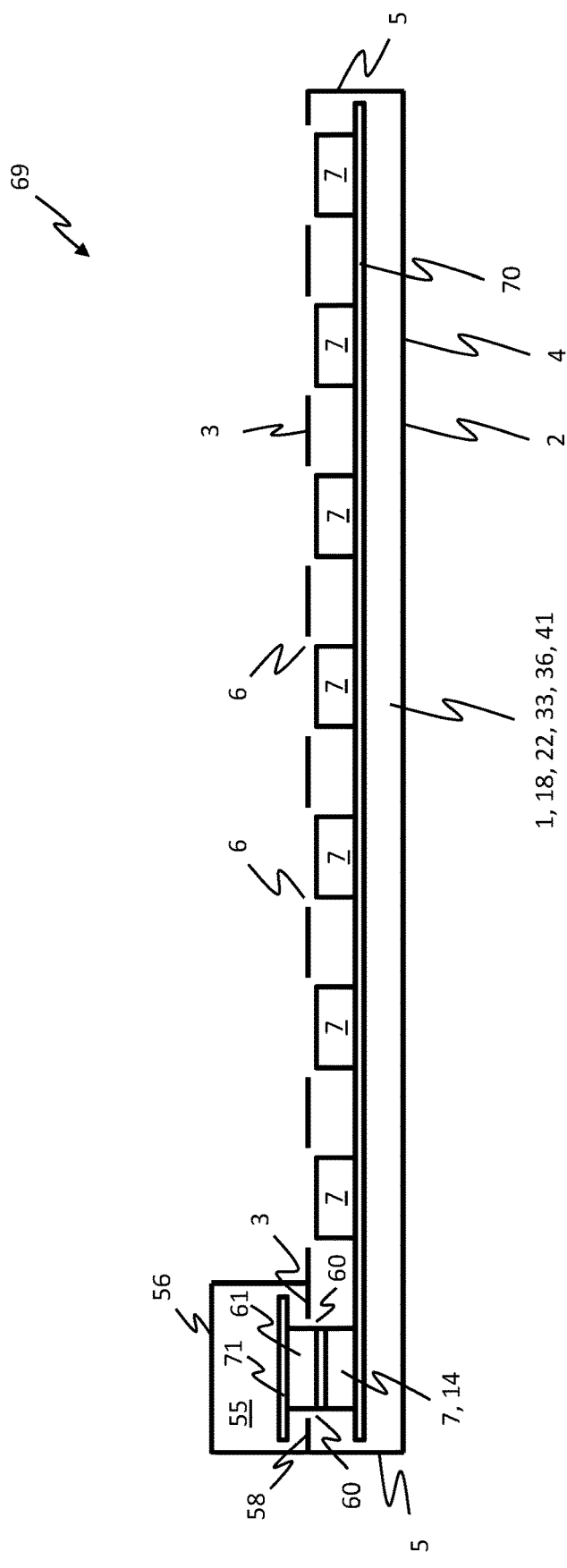
FIG. 13: the system of FIG. 12 in a cross-sectional view.

FIG. 13 schematically shows the switch-cabinet system 69 of FIG. 12 in a cross-sectional view on a plane XIII-XIII shown in FIG. 12 by dashed lines.

The connection elements 7 of the base module 1 may be arranged on a printed circuit board 70 arranged in housing 2, as shown as an example in FIG. 13. The module-connection element 61 of the functional module 55 may be arranged on a printed module-circuit board 71 arranged in the module housing 56. The module-connection element 61 protrudes through the aperture 60 of the module housing 56 and through an aperture 6 of the base module 1 and engages in the first connection element 14 of the base module 1.

Figure 14:
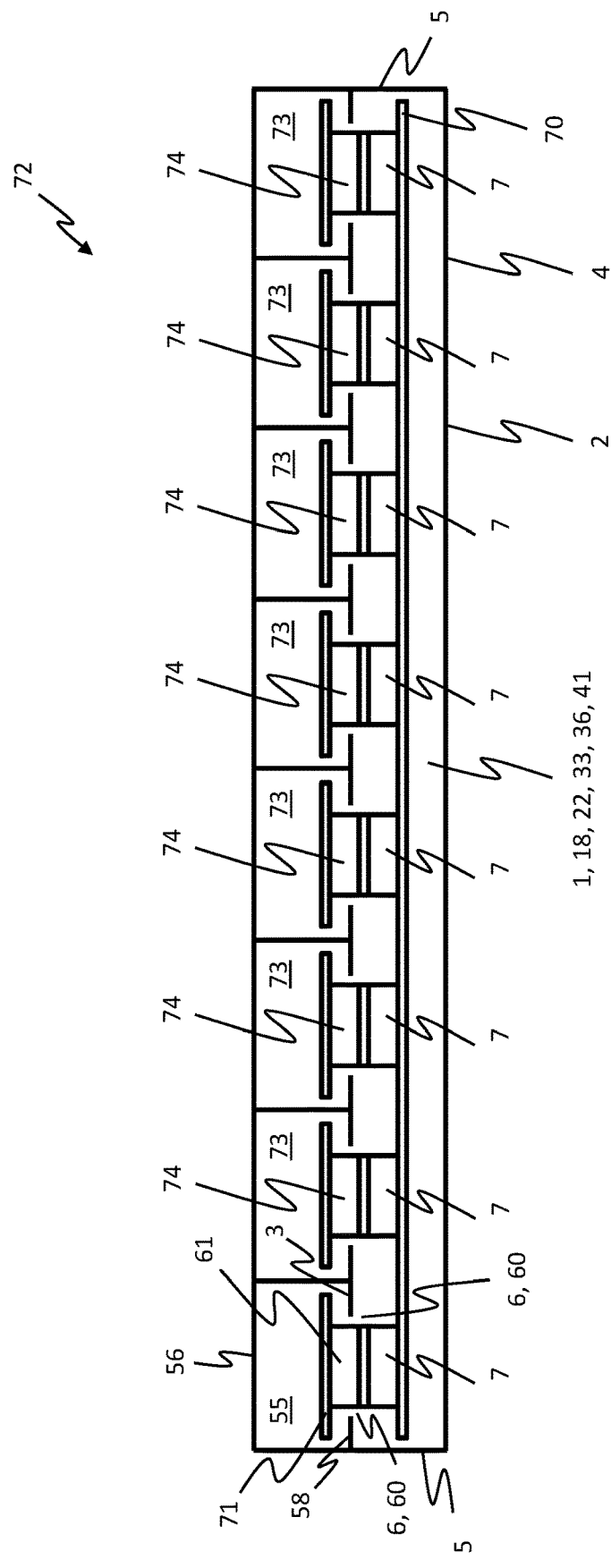
FIG. 14: a further switch-cabinet system in a cross-sectional view.

FIG. 14 schematically shows a further switch-cabinet system 72 in a cross-sectional view corresponding to FIG. 13. As in the case of the switch-cabinet system 69, the further switch-cabinet system 72 shows the first base module 1 according to the first embodiment. The description analogously applies to the second base module 18, the third base module 22, the fourth base module 33, the fifth base module 36 and the sixth base module 41.

In addition to the functional module 55 embodied as a feed-in module, the further switch-cabinet system 72 has at least one further functional module 73, which is embodied as an output module. As an example, the further switch-cabinet system 72 of FIG. 14 has seven further functional modules 73. Each of the further functional modules 73 has a further module-connection element 74. Each further module-connection element 74 protrudes through an aperture 6 of the base module 1. Each further module-connection element 73 of the further functional modules 73 engages in a connection element 7 of the base module 1. Data and supply voltages which may be fed into the base module 1 via the functional module 55 embodied as a feed-in module may be fed into the other functional modules 73 from the base module 1. The further functional modules 73 may, for example, forward supply voltages to subscribers in the field.

The further switch-cabinet system 72 offers the advantage that in case of a defect or of an exchange of a further functional module 73, further intact functional modules 73 may still be addressed via the data bus 10. This is made possible by the communication units 9 arranged in the first base module 1 which are each connected to the connection elements 7. For this reason, the further functional module 73 may be exchanged during operation of an automation system comprising the further switch-cabinet system 72. The automation system does not have to be initialized if a replacing further functional module 74 is already configured. If the further switch-cabinet system 72 or the automation system comprising the further switch-cabinet system 72 is used, for example in a production machine, this may prevent a downtime in production.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

The invention claimed is:

1. A base module for a switch-cabinet system comprising:
a plurality of communication units and connection elements for a plurality of functional modules;
wherein the connection elements are configured to engage in module-connection elements of functional modules,
wherein each connection element has at least one data connection,
wherein each communication unit is connected to at least one data connection of a connection element, respectively,
wherein the communication units are connected to each other via a data bus,
wherein the base module comprises a first field-bus connection, and
wherein the data bus is connected to the first field-bus connection for connecting the communication units to a field-bus.

2. The base module according to claim 1, wherein:
a data connection of a first connection element forms the first field-bus connection, and
wherein the data connection is adapted to engage with a first module data connection of a first module connection element of a functional module.

3. The base module according to claim 1, wherein:
a data connection of a second connection element forms a second field-bus connection,
wherein the data bus is connected to the second field-bus connection, and
wherein the data connection of the second connection element is configured to engage in a first module-data connection of a second module-connection element of a functional module.

4. The base module according to claim 1, wherein:
a first voltage connection of one of the connection elements forms a first supply connection for feeding a first supply voltage into the base module,
wherein at least one of the remaining connection elements has a further first voltage connection for conducting the first supply voltage to a functional module, and
wherein the first supply connection is connected to the further first voltage connection.

5. The base module according to claim 4, comprising:
a security device connected to the data bus;
wherein the safety device is connected at least to a safety circuit,
wherein the safety circuit is connected to the first supply connection, and
wherein the safety circuit is connected to the further first voltage connection for safely forwarding the first supply voltage to a functional module.

6. The base module according to claim 4, wherein:
the first supply connection is connected to a converter,
wherein the converter is connected to each communication unit, and
wherein the converter is adapted to provide a bus voltage to the communication units from the first supply voltage for operation.

7. The base module according to claim 6, wherein:
at least one of the connection elements has a bus-voltage connection for forwarding the bus voltage to a functional module, and
wherein the converter is connected to the bus-voltage connection.

8. The base module according to claim 1, wherein:
a monitoring unit is connected to the data bus, and
wherein the monitoring unit has at least one sensor connection.

9. A functional module for a switch-cabinet system comprising:
a first module-connection element which is configured to engage in a connection element of a base module in accordance with any one of the preceding claims;
wherein the functional module has a first field-bus-module connection,
wherein the first module-connection element has a first module-data connection,
wherein the first field-bus-module connection is connected to the first module-data connection, and
wherein the first module-data connection is configured to engage in a first data connection of a first connection element of the base module, said first data connection forming the first field-bus connection.

10. The functional module according to claim 9, comprising:
a further communication unit;
wherein the further communication unit is connected to the first field-bus-module connection and to the first module-data connection, and
wherein the further communication unit is connected to an electronic circuit.

11. The functional module according to claim 9, comprising:
a module-supply connection for feeding a supply voltage into the functional module;
wherein the module-supply connection is connected to a voltage connection of the first module-connection element for forwarding the supply voltage to the base module.

12. The functional module according to claim 9, comprising
a second field-bus-module connection and a second module-connection element;
wherein the second module-connection element has a first module-data connection,
where the second field-bus-module connection is connected to the first module-data connection of the second module-connection element, and
wherein the first module-data connection of the second module-connection element is configured to engage in a first data connection, forming a second field-bus connection, of a second connection element of the base module.

13. A switch-cabinet system comprising:
a base module having a plurality of communication units and connection elements for a plurality of functional modules;
wherein the connection elements are configured to engage in module-connection elements of functional modules,
wherein each connection element has at least one data connection,
wherein each communication unit is connected to at least one data connection of a connection element, respectively,
wherein the communication units are connected to each other via a data bus,
wherein the base module comprises a first field-bus connection, and
wherein the data bus is connected to the first field-bus connection for connecting the communication units to a field-bus; and
a functional module having a first module-connection element which is configured to engage in a connection element of a base module in accordance with any one of the preceding claims;
wherein the functional module has a first field-bus-module connection,
wherein the first module-connection element has a first module-data connection,
wherein the first field-bus-module connection is connected to the first module-data connection, and
wherein the first module-data connection is configured to engage in a first data connection of a first connection element of the base module, said first data connection forming the first field-bus connection; and
wherein the first module-connection element of the functional module engages in a first connection element of the base module.

14. The switch-cabinet system according to claim 13, comprising:
at least one further functional module;
wherein a further module-connection element of the further functional module engages in a connection element of the base module.

* * * * *